(12) United States Patent  
Kawate

(10) Patent No.: US 9,281,255 B2  
(45) Date of Patent: Mar. 8, 2016

(54) UNDERFILL COMPOSITION AND SEMICONDUCTOR DEVICE AND MANUFACTURING METHOD THEREOF

(71) Applicant: 3M INNOVATIVE PROPERTIES COMPANY, St. Paul, MN (US)

(72) Inventor: Kohichiro Kawate, Tokyo (JP)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/435,460

(22) PCT Filed: Oct. 29, 2013

(86) PCT No.: PCT/US2013/067173  
§ 371 (c)(1),  
(2) Date: Apr. 14, 2015

(87) PCT Pub. No.: WO2014/070694  
PCT Pub. Date: May 8, 2014

(65) Prior Publication Data  
US 2015/0332984 A1 Nov. 19, 2015

(30) Foreign Application Priority Data  
Oct. 31, 2012 (JP) ................... 2012-241063

(51) Int. Cl.  
*H01L 23/488* (2006.01)  
*H01L 23/29* (2006.01)  
(Continued)

(52) U.S. Cl.  
CPC .............. *H01L 23/293* (2013.01); *C08K 3/22* (2013.01); *C09K 5/14* (2013.01); *H01L 21/561* (2013.01);  
(Continued)

(58) Field of Classification Search  
CPC ... H01L 23/293; H01L 23/3157; H01L 24/17; H01L 24/81; H01L 24/94; H01L 21/563; H01L 21/78; H01L 2003/2227; H01L 2224/16145; H01L 2224/16227; H01L 2225/06513; H01L 2225/06517  
USPC ......... 257/676, 690, 773, 777, 778, 789, 791, 257/E23.116, E23.119, E23.135, E21.502, 257/E21.503, E21.511; 438/108, 113, 116, 438/127, 612; 522/34, 43; 523/216, 443, 523/524, 533  
See application file for complete search history.

(56) References Cited

U.S. PATENT DOCUMENTS 5,940,688 A * 8/1999 Higuchi ................ C08K 3/36  
                                             257/E23.119  
6,027,812 A     2/2000 Shiobara  
(Continued)

FOREIGN PATENT DOCUMENTS

JP     2001-302765     10/2001  
JP     2001-332520     11/2001  
(Continued)

OTHER PUBLICATIONS

International Search Report for PCT International Application No. PCT/US2013/067173, mailed on Jan. 24, 2014, 3 pages.

*Primary Examiner* — Dao H Nguyen  
(74) *Attorney, Agent, or Firm* — Adam Bramwell

(57) ABSTRACT

To provide a solid preapplication underfill material that has excellent workability, has a high degree of freedom for solder bonding processes, and enables the formation of a solder bond with high reliability. (Resolution Means) The underfill composition of the present disclosure contains a hardened epoxy resin and has a viscosity of 1000 Pa·s or more at 30° C. The hardening epoxy resin includes a crystalline epoxy resin at not less than 50 wt % relative to an entire resin composition.

12 Claims, 3 Drawing Sheets

(51) Int. Cl.
*H01L 21/30* (2006.01)
*C08F 2/46* (2006.01)
*H01L 21/56* (2006.01)
*H01L 25/00* (2006.01)
*H01L 23/31* (2006.01)
*H01L 23/00* (2006.01)
*H01L 25/065* (2006.01)
*H01L 21/78* (2006.01)
*C09K 5/14* (2006.01)
*C08K 3/22* (2006.01)

(52) U.S. Cl.
CPC .............. *H01L 21/563* (2013.01); *H01L 21/78* (2013.01); *H01L 23/3157* (2013.01); *H01L 24/17* (2013.01); *H01L 24/81* (2013.01); *H01L 24/94* (2013.01); *H01L 25/0657* (2013.01); *H01L 25/50* (2013.01); *C08K 2003/2227* (2013.01); *H01L 2224/16145* (2013.01); *H01L 2224/16227* (2013.01); *H01L 2225/06513* (2013.01); *H01L 2225/06517* (2013.01)

(56) References Cited

U.S. PATENT DOCUMENTS

| | | | |
|---|---|---|---|
| 6,228,681 B1 | 5/2001 | Gilleo | |
| 6,245,595 B1 | 6/2001 | Nguyen | |
| 6,255,409 B1* | 7/2001 | Matsuoka | C08G 59/38 257/793 |
| 6,383,659 B1 | 5/2002 | Honda | |
| 6,620,862 B2 | 9/2003 | Ueda | |
| 2002/0146861 A1 | 10/2002 | Standing | |
| 2002/0190370 A1 | 12/2002 | Shi | |
| 2003/0064223 A1 | 4/2003 | Simmons | |
| 2003/0068841 A1 | 4/2003 | Matsumura | |
| 2003/0111519 A1 | 6/2003 | Kinney | |
| 2003/0162911 A1 | 8/2003 | Xiao | |
| 2004/0232210 A1 | 11/2004 | Shah | |
| 2005/0131106 A1 | 6/2005 | Tonapi | |
| 2006/0134901 A1 | 6/2006 | Chaware | |
| 2006/0194064 A1 | 8/2006 | Xiao | |
| 2008/0036097 A1* | 2/2008 | Ito | C08L 63/00 257/778 |
| 2008/0265438 A1 | 10/2008 | Asano | |
| 2008/0280392 A1 | 11/2008 | Stapleton | |
| 2009/0142884 A1 | 6/2009 | Katoh | |
| 2010/0244279 A1* | 9/2010 | Hoshiyama | C08G 59/38 257/778 |
| 2011/0068483 A1* | 3/2011 | Katsurayama | C09D 163/00 257/778 |
| 2011/0086936 A1* | 4/2011 | Son | C08L 63/00 522/37 |
| 2013/0062748 A1* | 3/2013 | Tabei | H01L 23/293 257/676 |
| 2014/0008822 A1* | 1/2014 | Bai | H01L 23/293 257/793 |

FOREIGN PATENT DOCUMENTS

| | | |
|---|---|---|
| JP | 2003-082064 | 3/2003 |
| JP | 2003-174125 | 6/2003 |
| JP | 2003-243449 | 8/2003 |
| JP | 2005-105021 | 4/2005 |
| JP | 2006-229199 | 8/2006 |
| JP | 2006-245242 | 9/2006 |
| JP | 2007-009188 | 1/2007 |
| JP | 2007-211244 | 8/2007 |
| JP | 2007-246687 | 9/2007 |
| JP | 2007-326941 | 12/2007 |
| JP | 2008-239822 | 10/2008 |
| JP | 2008-274080 | 11/2008 |
| JP | 2009-024099 | 2/2009 |
| JP | 2009-029910 | 2/2009 |
| JP | 2009-203292 | 9/2009 |
| JP | 2010-111747 | 5/2010 |
| JP | 2010-171118 | 8/2010 |
| JP | 2011-014717 | 1/2011 |
| JP | 2012-119358 | 6/2012 |

* cited by examiner

UNDERFILL COMPOSITION AND SEMICONDUCTOR DEVICE AND MANUFACTURING METHOD THEREOF

CROSS REFERENCE TO RELATED APPLICATIONS

This application is a national stage filing under 35 U.S.C. 371 of PCT/US2013/067173, filed Oct. 29, 2013, which claims priority to JP Application No. 2012-241063, filed Oct. 31, 2012, the disclosure of which is incorporated by reference in its/their entirety herein.

BACKGROUND

The present disclosure relates to an underfill composition used in flip chip bonding. More specifically, the present disclosure relates to a hardening underfill composition that is solid at room temperature.

RELATED ART

Flip chip bonding refers to technology that forms a bump such as solder or the like on an electrode surface of a semiconductor element, places the semiconductor element and a substrate such that the bump faces the substrate, and forms an electrical bond between the semiconductor element and the substrate by melting the solder. With a structure obtained in this manner, damage to the bonding part is liable to occur due to heat stress because the thermal expansion coefficients of the semiconductor element, solder, and substrate are different.

The underfill material in flip chip bonding is applied between the semiconductor element and the substrate, and is used in order to reduce the damage to the solder bond due to the difference in the thermal expansion coefficients of the semiconductor element, solder, and the substrate. Conventional liquid underfill material is inserted using a capillary phenomenon between the semiconductor element and substrate (capillary underfill) after solder bonding. Furthermore, recently, a method has been proposed where the underfill material is applied in advance on the substrate or semiconductor element and then the solder bond is formed through the underfill (preapplied underfill).

The underfill material used in the applications such as flip chip bonding and the like has an elastic modulus of 5 to 15 GPa and a thermal expansion coefficient of 25 to 35 ppm. In order to achieve these physical properties, a large amount of inorganic particles must be mixed into a normal epoxy resin. However, the underfill material mixed with a large amount of inorganic particles is generally high in viscosity, and is not suitable as a preapplied type underfill material from the perspective of handling properties and the like.

Generally, the preapplied underfill material before solder bonding is classified into two types: solid underfill material and liquid underfill material. The solid underfill material is in a B stage state either by containing a normally solid resin or by being in a state where a certain level of a hardening reaction has progressed due to preheating a liquid composition. These solid underfill materials are comparatively high in viscosity and because a bonding process of applying heat and pressure is required, a flip chip bonder is often required when forming the solder bonding. However, if the cycle time of the flip chip bonder is long, for example one minute, increasing productivity is very difficult. Furthermore, with solid underfill material including solid resin, after the composition containing the solid resin and an organic solvent is applied to the substrate or to a wafer where the semiconductor element is formed, removing the organic solvent and drying to harden must be performed, and thus the organic solvent volatilized during drying may negatively affect the operator and the environment.

The liquid underfill material has a lower viscosity as compared to solid underfill material, but when mixed with a large amount of inorganic particles, the viscosity may be high to the point where a flip chip bonder is required. On the other hand, a liquid underfill material that basically does not include inorganic particles can form a solder bond by the weight of the semiconductor element. Therefore, when this liquid underfill material is used, a solder bond can be formed by aligning with the semiconductor element, placing on the substrate, and heating using an oven, hot plate, IR lamp, or the like, without providing an external force, and thus productivity can be increased dramatically. However, this liquid underfill material cannot sufficiently increase reliability in the bond, because the elastic modulus and thermal expansion coefficient cannot be optimized based on the amount of the inorganic material. Furthermore, when the liquid underfill material is applied to the electrode surface of the semiconductor element, because the material drips from the electrode surface of the semiconductor element facing downward when solder bonding, the material can only be applied to the substrate side. Furthermore, even if applied to the substrate, unless the solder bonding to the semiconductor element is immediately performed after application, the liquid underfill material flows and spreads to needless locations.

Japanese Unexamined Patent Application Publication No. 2007-9188 discloses "a resin composition used for a sealed resin for preapplication, containing (A) a thermosetting resin, (B) a hardening agent, (C) and a 1st solvent that has favorable dissolving properties towards the thermosetting resin, and poor dissolving properties towards the hardening agent, and (D) a 2nd solvent that has a lower boiling point than the 1st solvent."

Japanese Unexamined Patent Application Publication No. 2007-211244 discloses "an underfill sealing material that enables B stage processing, wherein the sealing material solidifies at a 1st temperature during B stage processing, forming a smooth, non-tacky front surface on a semiconductor wafer or silicon chip; essentially all of the sealing material hardens at a 2nd temperature that is higher than the 1st temperature; and the sealing material contains (a) a thermosetting resin, (b) an imidazole phosphate catalyst, (c) at least one solvent, (d) one or more fluxing agent, and possibly (e) one or more additive from a group consisting of a surfactant, a wetting agent, an antifoaming agent, a coupling agent, an inorganic filler, an adhesion promoting agent, a flow additive agent, a defoaming agent, and mixtures thereof."

Japanese Unexamined Patent Application Publication No. 2007-246687 discloses "an underfill liquid resin composition containing (A) a liquid epoxy resin and (B) a 1st hardening agent; wherein (B) the 1st hardening agent is an isocyanurate compound containing a carboxylic acid group."

OVERVIEW OF THE INVENTION

Problems to be Solved by the Invention

An object of the present disclosure is to provide a solid preapplication underfill material that is excellent in workability, has a high degree of freedom for solder bonding processes, and that can form a solder bond with high reliability. Furthermore, another object of the present disclosure is to provide a semiconductor device that uses the aforementioned preapplication underfill material, and a manufacturing method thereof.

SUMMARY

A first aspect of the present disclosure provides an underfill composition including a hardening epoxy resin and having a viscosity of 1000 P·as at 30° C. The hardening epoxy resin includes a crystalline epoxy resin of not less than 50 wt % relative to an entire resin composition.

Another aspect of the present disclosure provides a semiconductor device including a first semiconductor element having a surface with a plurality of first electrodes provided thereon; a substrate or a second semiconductor element having a surface with a plurality of second electrodes provided thereon; a hardened underfill composition disposed between the surface of the first semiconductor element and the surface of the substrate or the second semiconductor element; and the first electrodes and the second electrodes being electrically connected.

Another aspect of the present disclosure provides a manufacturing method for a semiconductor device, including the steps of providing a first semiconductor element having a surface with a plurality of first electrodes provided thereon; providing a substrate or a second semiconductor element having a surface with a plurality of second electrodes provided thereon; applying an underfill composition as described above to the surface of the first semiconductor element, the surface of the substrate or the second semiconductor element, or both surfaces; disposing the surface of the first semiconductor element so as to be facing the surface of the substrate or the second semiconductor element; liquefying the underfill composition with heat and electrically bonding the first electrodes and the second electrodes; and hardening the underfill composition.

Effect of the Invention

The underfill composition of an aspect of the present disclosure has a viscosity of 1000 Pa-·s or higher at 30° C., and because the composition includes 50 wt % or more of crystalline epoxy resin relative to the entire composition, the composition does not flow and does not demonstrate tackiness at room temperature. However, the viscosity of the composition drops rapidly when heated. Therefore, the composition excels in workability such as handling properties and the like at room temperature, and can be favorably used as a preapplication underfill material in various solder bonding processes. Furthermore, because the composition spreads rapidly between the semiconductor element and the substrate or another semiconductor element during solder bonding, a solder bond with high reliability can be formed even when an external force is not provided.

Note that the description above should not be considered as a complete disclosure of all embodiments of the present invention or of the advantages related to the present invention.

DETAILED DESCRIPTION

Figure 1:
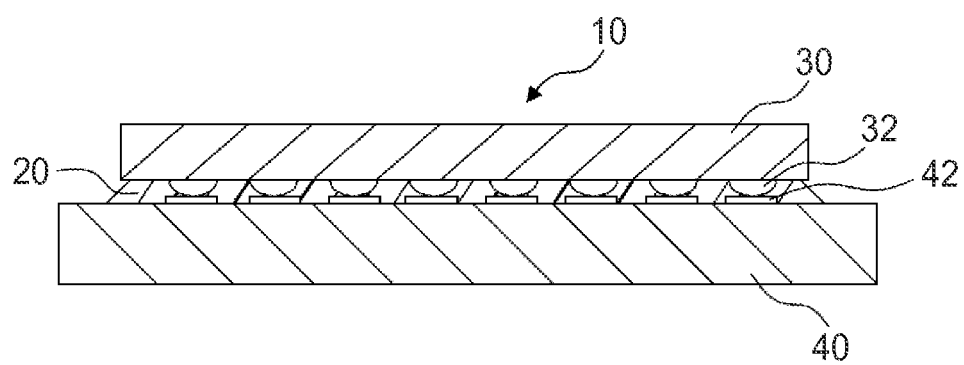
FIG. 1 is a schematic cross-sectional diagram of a semiconductor device containing an underfill composition according to an aspect of the present disclosure.

A detailed description for the purpose of illustrating representative embodiments of the present invention is given below, but these embodiments should not be construed as limiting the present invention.

An underfill composition according to an aspect of the present disclosure contains a hardening epoxy resin, and has a viscosity of 1000 Pa·s or more at 30° C. The hardening epoxy resin includes a crystalline epoxy resin at not less than 50 wt % relative to an entire resin composition.

The crystalline epoxy resin demonstrates crystallinity based on the molecular structure thereof, and therefore contributes to both a reduction of tackiness (tack free) of the underfill composition at room temperature, and a drop in melt viscosity during solder bonding. The crystalline epoxy resin according to the present disclosure refers to resin that is solid at room temperature (25° C.), melts in a specific temperature range, and becomes a liquid due to a rapid drop in viscosity. The melting temperature of the crystalline epoxy resin is generally approximately 50° C. or higher and approximately 120° C. or lower, however, approximately 55° C. or higher and approximately 105° C. or lower is advantageous. Furthermore, the melting viscosity of the crystalline epoxy resin is generally approximately 1 mPa·s or more and approximately 5 Pa·s or less at 150° C., but approximately 1 Pa·s or less is advantageous. The molar weight of the crystalline epoxy resin is generally approximately 800 or less, and is preferably approximately 500 or less. The crystalline epoxy resin generally has two or more epoxy groups in one molecule. The epoxy equivalent weight of the crystalline epoxy resin is generally approximately 100 or more and approximately 400 or less, and particularly approximately 150 or more and approximately 250 or less.

Examples of crystalline epoxy resins include, but are not limited to: biphenyl epoxy resin, bisphenol A epoxy resin, bisphenol F epoxy resin, stilbene epoxy resin, napthalene epoxy resin, anthracene epoxy resin, dihydroanthracene epoxy resin, hydroquinone epoxy resin, biphenyl novolac epoxy resin, and halogen adducts thereof (for example, bromides), as well as mixtures of two or more thereof. Of these, because a mixture of a liquid epoxy resin described later rapidly crystallizes at room temperature, biphenyl epoxy resin, particularly biphenyl epoxy resin with a molar weight of approximately 500 or more, can be advantageously used.

The hardening epoxy resin can include a liquid epoxy resin, a solid epoxy resin, or both. The tackiness at room temperature and the viscosity characteristics (for example, the change in viscosity from room temperature to solder bonding temperature) of the underfill composition can be adjusted using the liquid epoxy resin and/or solid epoxy resin. The type and blending quantity of the liquid epoxy resin and/or solid epoxy resin is selected so that the viscosity of the underfill composition at 30° C. is approximately 1000 Pa·s or higher, based on the type and blending quantity of the crystalline resin that is used, as well as type and blending quantity of other components, for example inorganic fillers and the like.

The liquid epoxy resin is a liquid at room temperature (25° C.), and is used to reduce the viscosity of the underfill composition. The viscosity of the liquid epoxy resin at 25° C. is generally approximately 100 Pa·s or less, and particularly approximately 10 Pa·s or less. The molar weight of the liquid epoxy resin is generally approximately 800 or less, and particularly approximately 500 or less. The liquid epoxy resin generally has two or more epoxy groups in one molecule. The epoxy equivalent weight of the liquid epoxy resin is generally approximately 100 or more and approximately 400 or less, and particularly approximately 150 or more and approximately 250 or less.

Examples of these liquid epoxy resins include, but are not limited to: bisphenol A epoxy resins, bisphenol F epoxy resins, bisphenol S epoxy resins, bisphenol D epoxy resins, dimer acid modified bisphenol A epoxy resins, o-allyl bisphenol A epoxy resins, phenol novolac epoxy resins, cresol novolac epoxy resins, 1,6 napathalenediol glycidyl ethers, tri-glycidyl ethers of aminophenols, cycloaliphatic epoxy resins, and halogen adducts thereof (for example, bromides), as well as mixtures of two or more thereof.

The solid epoxy resin is in a solid state or a semi-solid state at room temperature (25° C.), and the resin softens when the temperature rises, but unlike crystalline epoxy resins, does not demonstrate a rapid drop in viscosity. The molar weight of the solid epoxy resin is generally higher compared to crystalline epoxy resin, for example, approximately 1000 or more, or approximately 2000 or more, and approximately 50,000 or less, or approximately 30,000 or less. The softening point of the solid epoxy resin according to the ring and ball method is approximately 60° C. or higher and approximately 150° C. or lower. The solid epoxy resin generally has two or more epoxy groups in one molecule. The epoxy equivalent weight of the solid epoxy resin is generally approximately 100 or more and approximately 2000 or less, and preferably approximately 150 or more and approximately 1000 or less.

Examples of these solid epoxy resins include, but are not limited to: phenol novolac epoxy resins, cresol novolac epoxy resins, cresol napthol epoxy resins, biphenyl epoxy resins, biphenyl aralkyl epoxy resins, naphthalene epoxy resins, dicyclopentadiene epoxy resins, and halogen adducts thereof (for example, bromide), as well as mixtures of two or more thereof.

A small amount of chlorine derived from epichlorohydrin used in synthesis processing may be included in the crystalline epoxy resin, liquid epoxy resin, and solid epoxy resin. In order to prevent contamination of the semiconductor element, the chlorine content in the entire resin composition including these epoxy resins is particularly approximately 1500 ppm or less, and more particularly approximately 1000 ppm or less.

The underfill composition of the present disclosure includes approximately 50 wt % or more of crystalline epoxy resin relative to the entire resin composition including the crystalline epoxy resin, liquid epoxy resin, and solid epoxy resin. In a number of embodiments, the underfill composition includes approximately 50 wt % or more and approximately 90 wt % or less, approximately 80 wt % or less, or approximately 70 wt % or less of crystalline epoxy resin, relative to the entire resin composition. If the amount of the crystalline epoxy resin is within the aforementioned range, the viscosity will be suitable for printing the underfill composition on the semiconductor element in a temperature range that is higher than room temperature and lower than the solder bonding temperature, for example 70° C. or the like, and the fluidity and tackiness of the underfill composition at room temperature can be controlled.

In a number of embodiments, the underfill composition includes approximately 10 wt % or more, approximately 20 wt % or more, or approximately 30 wt % or more, and approximately 50 wt % or less, approximately 45 wt % or less, or approximately 40 wt % or less of liquid epoxy resin, relative to the entire resin composition. In a number of embodiments, the underfill composition includes approximately 1 wt % or more, or approximately 2 wt % or more, and approximately 10 wt % or less, or approximately 5 wt % or less of solid epoxy resin, relative to the entire resin composition. In certain embodiments, the underfill composition does not include a solid epoxy resin with a molar weight of 1000 or more for example. In certain embodiments, the hardening epoxy resin only contains crystalline epoxy resin and liquid epoxy resin. An underfill composition that does not include the solid epoxy resin has a viscosity that rapidly drops when heated and has very low viscosity at the solder bonding temperature, and therefore, even if the interval (gap) is narrow between the semiconductor and another semiconductor or the substrate, the gap can be uniformly filled in a short period of time.

The underfill composition may contain an inorganic filler. When an inorganic filler is included in the underfill composition, the thermal expansion coefficient of the hardened underfill composition can be reduced. Examples of these inorganic fillers include fused silica, crystalline silica, alumina, titanium oxide, silica titania, boron nitride, aluminum nitride, silicon nitride, magnesia, magnesium silicate, aluminum, and the like, as well as mixtures of two or more thereof. Fillers with high specific gravity such as alumina and the like have a tendency to settle and separate during storage when included in the liquid underfill material. Because the underfill composition of the present disclosure has very high viscosity at room temperature, fillers with high specific gravity can be maintained in a uniformly dispersed state even after extended storage.

In one embodiment, the inorganic filler is spherical. Compared to crushed fillers such as crushed silica and the like, spherical inorganic fillers can further enhance the fluidity of the underfill composition. The mean particle diameter of the inorganic filler is generally approximately 0.1 µm or more, and approximately 10 µm or less, and preferably approximately 5 µm or less. The maximum particle diameter of the inorganic filler is generally approximately 50 µm or less, and preferably approximately 20 µm or less. The reliability of the solder bond can be enhanced by setting the mean particle diameter and maximum particle diameter within the aforementioned range. The mean particle diameter and maximum particle diameter can be determined by a particle size distribution measuring device using the laser diffraction method, and the mean particle diameter is the value measured as the mass average value D50 (particle diameter or median diameter at a cumulative mass of 50%) in the particle size distribution measurement using the laser diffraction method.

The blending quantity of the inorganic filler can be approximately 100 mass parts or more, approximately 200 mass parts or more, or approximately 300 mass parts or more, and approximately 1000 mass parts or less, approximately 800 mass parts or less, or approximately 500 mass parts or less relative to 100 mass parts of all resin components, considering the thermal expansion coefficient of the hardened underfill composition, the fluidity of the underfill composition at the solder bonding temperature, the reliability of the solder bond, and the like.

The underfill composition of one embodiment of the present disclosure has very low viscosity at high temperature, and therefore a thermal conductivity can be enhanced by using a large amount of inorganic filler. The underfill composition with high thermal conductivity can be advantageously used for heat dissipation of semiconductor elements with a large heating value, and particularly for heat dissipation with high density packaging of these semiconductor elements. In a number of embodiments, the thermal conductivity of the underfill composition is approximately 1.0 W/mk or more, or approximately 1.2 W/mK or more. If used for heat dissipation applications, the blending quality of the inorganic filler is generally approximately 200 mass parts or more or approximately 300 mass parts or more, and approximately 1000 mass parts or less or approximately 800 mass parts or less, relative to 100 mass parts of all resin components. Because alumina has high thermal conductivity, when an underfill composition containing alumina as the inorganic filler is used, the thermal conductivity of the hardened underfill composition can be particularly enhanced.

When blending the inorganic filler, dispersing agents such as, for example, silica coupling agents, titantate coupling agents, phosphate ester wetting and dispersing agents, polymer system lubricants, and the like can be used in order to enhance the compatibility of the resin composition and the inorganic filler. Examples of these dispersing agents include, but are not limited to: silane coupling agents such as γ-glycidoxy propyl trimethoxysilane, γ-glycidoxy propyl methyl diethoxysilane, β-(3,4-epoxy cyclohexyl) ethyl trimethoxysilane and other epoxy silanes; N-β-(aminoethyl)-γ-aminopropyl trimethoxysilane, γ-amino propyl triethoxysilane, N-phenyl-γ-amino propyl trimethoxysilane and other amino silanes; γ-mercapto propyl trimethoxysilane and other mercapto silanes; titanate coupling agents such as isopropyl triisosteroyl titanate, isopropyl tri-(N-amino ethyl amino ethyl) titanate, diisopropyl bis(dioctyl phosphate) titanate, tetraisopropyl bis(dioctyl phosphate) titanate, tetraoctyl bis(ditridecyl phosphate) titanate, tetra(2,2-diallyloxy methyl-1-butyl) bis(ditridecyl)phosphate titanate, bis(dioctyl pyrophosphate) oxyacetate titanate, bis(dioctyl pyrophosphate)ethylene titanate, and the like; phosphoric acid ester lubricating agents such as phosphoric acid monoesters, or phosphoric acid diesters obtained by reacting phosphoric acid and alcohols with a polylactone backbone or olefin backbone; and other polymeric lubricating agents such as poly(alkyleneimine modified lactone polymers); and the like. The type and blending quantity of the dispersing agents can be appropriately determined based on the type and the blending quantity of the inorganic filler.

The underfill composition may contain a hardening agent. Examples of hardening agents include, but are not limited to: polyaddition hardening agents, catalyst hardening agents, condensation hardening agents, and the like. The hardening agents can be used inidividually or in combination of two or more, based on the characteristics of the hardening material and the type of epoxy resin.

Examples of polyaddition hardening agents include, but are not limited to: polyamine compounds such as diethylenetriamine (DETA), triethylenetetramine (TETA), metaxylylene diamine (MXDA), and other aliphatic polyamines, diaminodiphenyl methane (DDM), m-phenylenediamine (MPDA), diaminodiphenyl sulfone (DDS), and other aromatic polyamines, dicyandiamide (DICY), organic acid dihydrazides, and the like; anhydrides including alicyclic acid anhydrides such as hexahydro phthalic anhydride (HHPA), methyl tetrahydro phtalic anhydride (MTHPA), and aromatic acid anhydrides such as trimellitic anhydride (TMA), pyromellitic dianhydride (PMDA), benzophenone tetracarboxylic dianhydride (BTDA), and the like; polyphenol compounds such as novolac phenolic resin, phenol polymers, and the like; polymercaptan compounds such as polysulfide, thioester, thioether, and the like; isocyanate compounds such as isocyanate prepolymers, blocked isocyanates, and the like; organic acids such as polyester resins containing carboxylic acids; and the like. Acid anhydrides and polyamine compounds that are relatively weak bases such as dicyandiamides, organic acid dihydrazides, and the like can be advantageously used from the perspective of compatibility with the fluxing agents described later, and because water absorbing properties are low, polyamine compounds such as dicyandiamides, organic acid dihydrazides, and the like can be particularly advantageous in use. The polyaddition hardening agents may also be used as a fluxing agent.

Examples of catalyst hardening agents include, but are not limited to: benzyl dimethyl amine (BDMA), 2,4,6-tris dimethylaminomethyl phenol (DMP-30), and other tertiary amine compounds, 2-methyl imidazole, 2-ethyl-4-methyl imidazole (EMI24), and other imidazole compounds, BF3 complex and other Lewis acids, and the like.

Examples of condensation hardening agents include, but are not limited to: phenol resins such as resole phenolic resins and the like, urea resins such as urea resins containing a methylol group, melamine resins such as melamine resins containing a methylol group, and the like.

The amount of hardening agent used is approximately 0.1 mass parts or more, approximately 1 mass parts or more, or approximately 2 mass parts or more, and approximately 20 mass parts or less, approximately 15 mass parts or less, or approximately 10 mass parts or less relative to 100 mass parts of all resin components, considering the hardening properties of the underfill composition, and the thermal resistance and moisture resistance of the hardened material.

The underfill composition can also contain fluxing agents. Because fluxing agents have a function of reducing oxide layers on the surface of the solder bump, when an underfill composition containing a fluxing agent is used, the oxide layers on the surface of the solder bump can be chemically removed, and a solder bond with even higher reliability can be formed. With this embodiment, a fluxing agent does not need to be applied in advance to the electrode of the semiconductor element and/or the substrate during solder bonding. The fluxing agent can have a functional group that reacts with the epoxy resin, and in this case, the fluxing agent can also act as the hardening agent.

Examples of fluxing agents include, but are not limited to: simple carboxylic acids such as formic acid, acetic acid, benzoic acid, and the like; compounds containing one phenolic hydroxyl group such as phenol, naphthol, and the like; polyhydric phenol compounds such as biphenol, hydroquinone, resorcinol, catechol, methylidyne diphenol, ethylidene diphenol, isopropylidene diphenol, pyrogallol, hydroxyhydroquinone, and the like; phenol compounds having a carboxyl group such as 4-hydroxy benzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, gallic acid, 1,4-dihydroxy-2-napthoic acid, 3,5-dihydroxy-2-napthoic acid, 3,7-dihydroxy-2-napthoic acid, phenolphthalin; and the like. Phenol compounds having a carboxyl group such as 4-hydroxybenzoic acid and the like can be advantageously used as a fluxing agent, and because these fluxing agents have a carboxyl group, the fluxing agent can be advantageously used as a hardening agent in combination with a polyamine compound such as dicyandiamide, organic acid dihydrazides, and the like that are relatively weak bases.

The blending quantity of the fluxing agent is generally approximately 0.1 mass parts or more, or approximately 0.5 mass parts or more, and approximately 20 mass parts or less, or approximately 10 mass parts or less, relative to a total of 100 mass parts of all resin components and hardening agents.

The underfill composition can further contain additives such as, for example, flame retardants, pigments, dyes, core and shell particles, leveling agents, defoaming agents, reactive diluents, solvents, and the like. The blending quantity of these additives can be appropriately determined within a range that does not detract from the effect of the present invention.

For example, the underfill composition can be prepared by mixing the hardening epoxy resin containing crystalline epoxy resin, liquid epoxy resin, and if necessary, solid epoxy resin at a temperature not lower than the melting point of the crystalline epoxy resin, cooling the mixture to room temperature to form a supercooled liquid, and then mixing the inorganic filler, hardening agent, fluxing agent, and other additives. Because the obtained mixture is crystallized by being allowed to sit at a low temperature, the mixture can be handled as a waxy solid. Alternatively, crystallization of the mixture can be accelerated by providing a stimulus using a method such as applying a shearing force and the like on the mixture even at room temperature.

The viscosity of the underfill composition is approximately 1000 Pa·s or more at 30° C. In certain embodiments, the viscosity of the underfill composition at 30° C. is approximately 1000 Pa·s or more, or approximately 2000 Pa·s or more, and approximately 20,000 Pa·s or less, or approximately 10,000 Pa·s or less. The underfill composition has a viscosity that is 1000 Pa·s or more at 30° C., and therefore at room temperature (25° C.), the composition does not flow, and tackiness is not demonstrated. Therefore, the underfill material is applied on the solder bump of the electrode surface of the semiconductor element, and can be favorably used in an OBAR (Over Bump Applied Resin) process that includes facing the electrode surface downward during solder bonding.

In certain embodiments, the viscosity of the underfill composition at 70° C. is approximately 50 Pa·s or less. In certain embodiments, the viscosity of the underfill composition at 70° C. is approximately 1 Pa·s or more, or approximately 5 Pa·s or more, and approximately 50 Pa·s or less, or approximately 20 Pa·s or less. The underfill composition having these viscosity characteristics has excellent printing characteristics when the hardening agent is heated to a temperature where a reaction does not occur, and is advantageously applied to the semiconductor element or the substrate using stencil printing, screen printing, and the like.

In certain embodiments, the viscosity of the underfill composition at 175° C. is approximately 10 Pa·s or less. In certain embodiments, the viscosity of the underfill composition at 175° C. is approximately 0.1 Pa·s or more, or approximately 1 Pa·s or more, and approximately 10 Pa·s or less, or approximately 5 Pa·s or less. With the underfill composition having these viscosity characteristics, the solder bump can easily push aside the liquefied underfill composition during solder bonding, and thus deformation of the solder bump caused by the underfill composition can be effectively controlled.

The underfill composition of the present disclosure can be used as a preapplication underfill material, and the composition can be applied to the semiconductor element or the substrate before the solder bond process. By heating at the solder melting point or higher in a state where either the semiconductor elements or the semiconductor element and the substrate are aligned, the underfill composition liquefies and fills the gap between the semiconductor elements or the semiconductor element and the substrate. The solder bump on the semiconductor element melts while passing through the underfill composition, and a metal bond is formed between the solder bump and the electrode that is on the other semiconductor element or on the substrate. The solder bond is reinforced by hardening of the hardening epoxy resin in the underfill composition.

A manufacturing method for a semiconductor device according to one aspect of the present disclosure includes the steps of: providing a first semiconductor element having a surface with a plurality of 1st electrodes provided thereon; providing a substrate or a second semiconductor element having a surface with a plurality of second electrodes provided thereon; applying an underfill composition to the surface of the first semiconductor element, the surface of the substrate or the second semiconductor element, or both surfaces; disposing the surface of the first semiconductor element so as to be facing the surface of the substrate or the second semiconductor element; liquefying the underfill composition with heat and electrically bonding the 1st electrodes and the second electrodes; and hardening the underfill composition. In this manner, the electrode component can be sealed and the solder bond can be performed simultaneously. The sealing of the electrode component and the formation of the solder bond can be performed using various heating devices such as a flip chip bonder, oven, hot plate, IR lamp, and the like. In certain embodiments, the sealing of the electrode component and the formation of the solder bond can be performed without increasing pressure, using an oven, hot plate, IR lamp, or the like for example, by heating at approximately 150° C. to approximately 250° C., for example, at 180° C., 200° C., or 220° C. The manufacturing method of the present disclosure is favorably used for bonding and sealing of semiconductor elements such as flip chips, CSP (chip size packages), and the like.

One embodiment of the present disclosure can provide a semiconductor device including a first semiconductor element having a surface with a plurality of first electrodes provided thereon; a substrate or a second semiconductor element having a surface with a plurality of second electrodes provided thereon; and a hardened underfill composition, disposed between the surface of the first semiconductor element and the surface of the substrate or the second semiconductor element; and with the first electrodes and the second electrodes electrically connected. FIG. 1 is a schematic cross sectional diagram of the semiconductor device of an embodiment of the present disclosure. In a semiconductor device 10, a solder bump 32 (electrode) of a semiconductor element 30 and substrate wiring 42 (electrode) of a substrate 40 are electrically bonded; a hardened underfill composition 20 is disposed between the semiconductor element 30 and the substrate 40; and the electrical bond between the solder bump 32 and the substrate wiring 42 is protected.

The underfill composition of the present disclosure can be applied by printing onto the electrode front surface of the semiconductor element or the substrate. Normally, the underfill composition is melted by heating at approximately 50° C. to approximately 100° C., for example, at 70° C., 80° C., or 90° C., and then the composition can be directly applied by printing onto the electrode front surface of the semiconductor element or the substrate, using a metal mask, mesh mask, or the like. In certain embodiments, the underfill composition is applied by printing onto the electrode front surface of the other semiconductor element.

The underfill composition of the present disclosure is printed onto a water soluble film, and the film with the printed underfill composition is laminated onto the semiconductor element so that the underfill composition touches the electrode front surface of the semiconductor element. The underfill composition can then be applied onto the electrode front surface of the semiconductor element by dissolving the water soluble film. If the cohesive force of the underfill composition is relatively low, when the underfill composition is applied to a normal liner film, and the underfill composition is transferred onto the electrode front surface of the semiconductor element by laminating the liner film onto the semiconductor element, cohesive failure might occur inside the underfill composition during removal of the liner film. In these cases, transfers using the aforementioned water soluble film can be particularly advantageously used.

Examples of water soluble films include films containing water soluble substances such as, but not limited to: polyvinyl alcohol, polyvinyl butyral, polyethylene glycol, polypropylene glycol, polyvinylpyrrolidone, methylcellulose, carboxymethyl cellulose, gelatin, starch, and the like. A polyvinyl alcohol film can be advantageously used because the film has high strength, low tackiness in a high humidity environment, and dissolves rapidly in cold water. The water soluble film can be dissolved using pure water at room temperature or elevated temperature.

The underfill composition can be applied to one section of the electrode front surface of the semiconductor element, thereby exposing a partial area of the electrode front surface. One or a plurality of electrodes that are not covered by the underfill composition can be included in this area. If an opaque inorganic filler such as alumina for example is included in the underfill composition, or if the underfill composition has high crystallinity, the underfill composition becomes opaque, and checking the electrode covered by the composition from the outside might be difficult. If a part of the semiconductor element electrode is not filled by the underfill composition in an exposed state, alignment of the substrate or other semiconductor element to the semiconductor element where the underfill composition has been applied can be performed using these exposed electrodes. The exposed electrode is covered by the liquefied underfill composition during solder bonding.

The underfill composition can be applied to a semiconductor wafer where the plurality of semiconductor elements are formed, and then the semiconductor wafer cut and divided into individual semiconductor elements where the underfill composition has been applied. Cutting can be performed by a wet or dry process using a standard dicing device.

The underfill composition is applied to the semiconductor wafer in a pattern that covers a portion of the electrode front surface of the semiconductor elements corresponding to individual semiconductor elements, and the semiconductor wafer can be cut in a region where the underfill composition is not applied, without cutting the underfill composition. With this embodiment, because blades of the dicing device do not contact the underfill composition, the dicing precision can be increased, and the life of the blades can be extended. Furthermore, after dividing into individual semiconductor elements, the divided semiconductor elements can be picked up without touching the underfill composition by bringing vacuum tweezers or the like into contact with the area where the underfill composition is not applied for example. With this embodiment, contamination from the underfill composition and pickup failure by the pickup device such as vacuum tweezers or the like can be prevented.

Figure 2A:
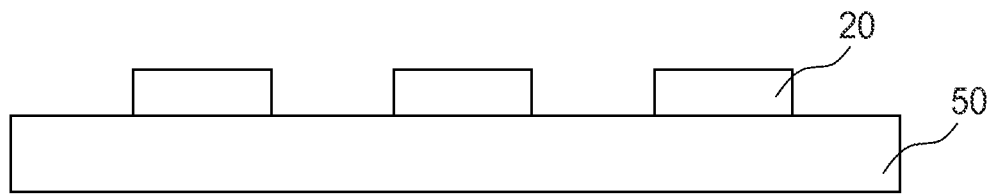
FIG. 2A is a flow chart depicting an aspect of an application method of the underfill composition of the present disclosure.
Figure 2B:
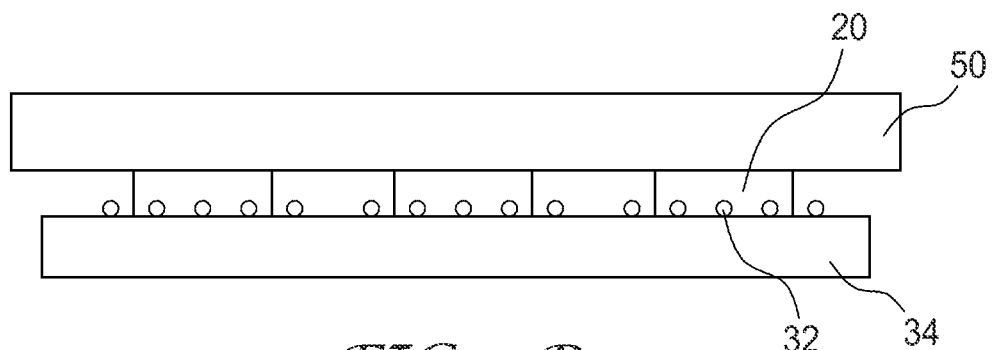
FIG. 2B is a flow chart depicting an aspect of an application method of the underfill composition of the present disclosure.
Figure 2C:
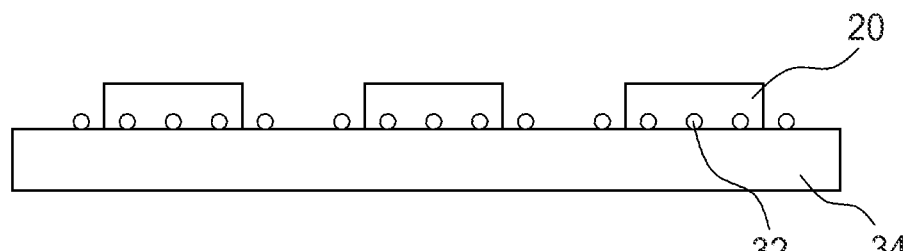
FIG. 2C is a flow chart depicting an aspect of an application method of the underfill composition of the present disclosure.
Figure 2D:
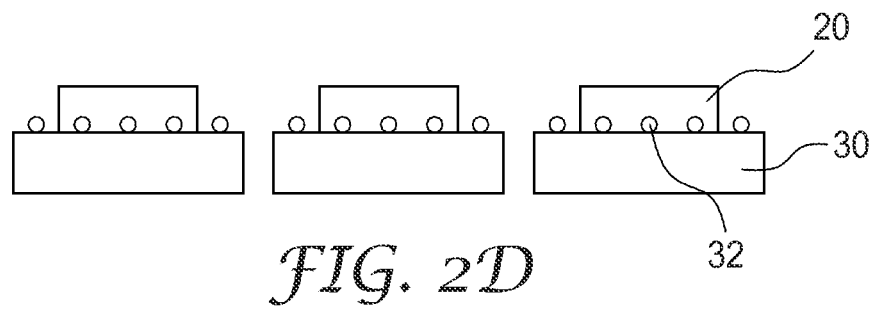
FIG. 2D is a flow chart depicting an aspect of an application method of the underfill composition of the present disclosure.
Figure 2E:
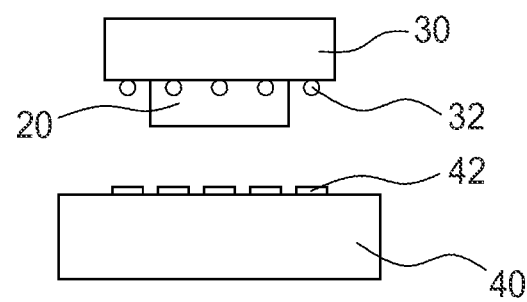
FIG. 2E is a flow chart depicting an aspect of an application method of the underfill composition of the present disclosure.
Figure 2F:
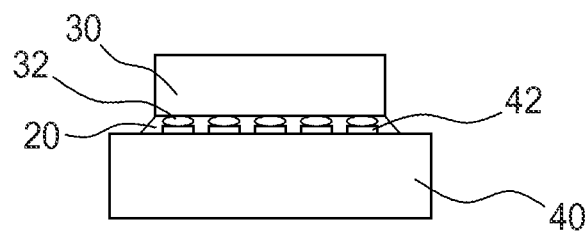
FIG. 2F is a flow chart depicting an aspect of an application method of the underfill composition of the present disclosure.

An example of the manufacturing method of the semiconductor device is described while referring to FIGS. 2A to 2F. The underfill composition 20 is applied by printing and the like onto a water soluble film 50 (FIG. 2A) in a pattern that covers a portion of the electrode front surface of the semiconductor elements corresponding to individual semiconductor elements. The water soluble film 50 with the applied underfill composition 20 is laminated such that the underfill composition 20 faces the solder bump, on the semiconductor wafer 34 where a plurality of semiconductor elements are formed each having a plurality of solder bumps 32 (electrodes) (FIG. 2B). The water soluble film 50 is dissolved and removed in pure water and the like (FIG. 2C). A portion of the plurality of solder bumps 32 (electrodes) of each semiconductor is exposed at this time. The semiconductor wafer 34 is cut in a region where the underfill composition 20 is not applied using the dicing device and the like, and divided into individual semiconductor elements 30 (FIG. 2D). The electrode front surface where the underfill composition 20 of the semiconductor element 30 is applied is disposed so as to face downward towards the front surface of the substrate wiring 42 of the substrate 40 (FIG. 2E). Alignment of the substrate 40 to the semiconductor element 30 can be performed using the exposed solder bumps 32 (electrodes) that are not covered by the underfill composition at this time. The underfill composition 20 on the electrode front surface of the semiconductor element 30 contacts the substrate 40; the underfill composition 20 is liquefied by heating; the solder bumps 32 (electrodes) are electrically connected with the substrate wiring 42 (electrodes); and then the underfill composition 20 hardens (FIG. 2F). In this manner, the semiconductor device 10 illustrated in FIG. 1 can be manufactured.

EXAMPLES

In the following examples, specific embodiments of the present disclosure are exemplified, but the present invention is not restricted thereto. All parts and percentages are based on weight unless otherwise indicated.

Evaluation Method

The characteristics of the underfill composition of the present disclosure were evaluated in accordance with the following methods.

Viscosity

The underfill composition was interposed between an aluminum circular plate (upper) with a diameter of 25 mm and an aluminum circular plate with a diameter of 50 mm (lower), and the viscosity at 1 Hz was measured using an ARES (Rheometric Scientific Inc.) in a temperature range of 0° C. to 200° C. and at a temperature increase rate of 20° C./minute.

Tackiness at 30° C.

The presence or absence of tackiness was determined by examination by touch at 30° C. Tackiness was not observed when the aforementioned viscosity was 1000 Pa·s or higher.

Thermal Conductivity

Hardened material obtained by injecting underfill composition into a silicone mold and hardening for four hours at 150° C. was cut out in a disk shape with a diameter of 50 mm at a thickness of 2 mm to produce a test piece. Thermal conductivity of the obtained test piece was measured by a circular plate heat flow meter method (in accordance with ASTM E1530).

Tg (Glass Transition Temperature)

Hardened material obtained by injecting underfill composition into a silicone mold and hardening for four hours at 150° C. was cut out in the shape of a rectangle of 35 mm×10 mm at a thickness of 2 mm to produce a test piece. The storage modulus E' and loss elastic modulus E" were measured when bending deflection was performed on the test piece at a strain of 0.025% at 1 Hz using a dynamic viscoelasticity measuring device RSA-III (Rheometric Scientific Inc.) across a temperature range of 25° C. to 260° C. The temperature where Tan δ=E"/E' is maximized was defined as the glass transition temperature Tg.

Thermal Expansion Coefficient

Hardened material obtained by injecting underfill composition into a silicone mold and hardening for four hours at 150° C. was cut out to a size of 10 mm×5 mm×5 mm to produce a test piece. The length of the longest side of the test piece was measured using a thermomechanical analyzing device TMA 8310 (Rigaku Corporation) in nitrogen gas across a temperature range of 15° C. to 250° C., at a temperature increase rate of 20° C./minute, and a load of 1 g (10 mmN) The thermal expansion coefficient (CTE) was calculated using the slope of the tangent line at 30° C.

Plasticity

The underfill composition was applied onto a glass plate in the shape of a square 7 mm×7 mm and a thickness of 0.5 mm at 70° C., and after the glass plate was left horizontally for two hours at 25° C., the glass plate was tilted to an angle of 45 degrees and maintained for one hour at 25° C. A sample was defined as "having plasticity" if the underfill composition did not flow from the applying position.

Fluidity

The underfill composition was applied onto a glass plate in the shape of a square 7 mm×7 mm and a thickness of 0.06 mm at 70° C., and after the glass plate was left horizontally for two hours at 25° C., a separate glass plate with a weight of 2.23 g was overlaid thereon, and placed on a 275° C. hot plate for 60 seconds. A measurement was taken of one side R of the approximately square area where the underfill composition flowed and spread due to the weight of the glass plate.

Solderability

The underfill composition was applied onto a printed board in the shape of a square 7 mm×7 mm and a thickness of 0.06 mm at 70° C., and after the glass plate was left horizontally for two hours at 25° C., a semiconductor element (chip) with 24 lead-free solder bumps with a pitch of 0.5 mm was placed thereon. A 12 mm×5 mm×5 mm SUS block (2.31 g) was overlaid on the chip in order to accelerate solder bonding. The printed board was placed on a 275° C. hot plate for 120 seconds, and if the 24 solder bumps bonded with the electrodes on the printed board, the test sample was evaluated as "OK".

The reagents, raw materials, and the like used in these examples are shown below in Table 1.

TABLE 1

| Trade Name | Description | Supplier |
|---|---|---|
| YX4000H | Biphenyl crystalline epoxy resin<br>Epoxy equivalent weight 187 to 197 | Mitsubishi Chemical Corporation |
| YDF870-GS | Bis F epoxy resin<br>Epoxy equivalent weight 155 to 170 | Nippon Steel Chemical Corporation |
| ZX1059 | Mixture of bis A epoxy resin and bis F epoxy resin<br>Epoxy equivalent weight 160 to 170 | Nippon Steel Chemical Corporation |
| ZX1658-GS | Cycloaliphatic epoxy resin | Nippon Steel Chemical Corporation |
| PARALOID (trademark) EXL-2691A | Core shell particle | The Dow Chemical Company |
| CG1200G | Hardening agent Dicyandiamide | Air Products Japan, Inc. |
| Disperbyk (trademark)111 | Phosphate ester wetting and dispersing agent | BYK Japan KK |
| Solplus (trademark) D510 | Polymer lubricant | The Lubrizol Corporation |
| 4HBA | Fluxing agent 4-hydroxy benzoic acid | Sigma-Aldrich Japan Co., LLC |
| AA-1.5 | Spherical alumina Mean particle size 1.5 μm | Sumitomo Chemical Corporation |
| BMA-3 | Spherical alumina Mean particle size 0.8 μm | Baikowski Japan |
| AM5-15R | Spherical alumina Mean particle size 3 μm | Nippon Steel Materials Co., Ltd. |

Underfill compositions were prepared as follows in accordance with the formulations shown in Table 2. After mixing epoxy resin for one hour at 125° C., and forming a uniform liquid mixture, the remaining components were mixed with the liquid mixture. Afterwards, the obtained composition was solidified (crystallized) by storing for 14 days or more at −20° C.

TABLE 2

| | Example 1 | Example 2 | Example 3 | Example 4 | Example 5 | Example 6 | Comparative Example 1 |
|---|---|---|---|---|---|---|---|
| YX4000H | 52 | 52 | 52 | 50 | 52 | 60 | 52 |
| YDF870 - GS | 48 | 48 | 48 | — | — | 20 | 24 |
| ZX1059 | — | — | — | 40 | 48 | — | — |
| ZX1658 - GS | — | — | — | — | — | 20 | 24 |
| EXL - 2691A | — | — | — | 10 | — | — | — |
| CG1200G | 5 | 5 | 5 | 5 | 6 | 6 | 5 |

TABLE 2-continued

|  | Example 1 | Example 2 | Example 3 | Example 4 | Example 5 | Example 6 | Comparative Example 1 |
|---|---|---|---|---|---|---|---|
| Disperbyk (trademark) 111 | 3 | 3 | 3 | 5 | 5 | 3 | 3 |
| Solplus (trademark)D510 | — | 3 | — | — | — | 3 | 3 |
| 4HBA | 1 | 1 | 1 | 1 | 1 | 1 | 1 |
| AA - 1.5 | — | 250 | — | 250 | 250 | 180 | 180 |
| BMA - 3 | — | 80 | — | 80 | 80 | 150 | 150 |
| AM5 - 15R | 320 | — | 280 | — | — | — | — |

The evaluation results of the underfill compositions of Examples 1 through 6 and Comparative Example 1 are presented in Table 3.

TABLE 3

|  | Tackiness (30° C.) | Viscosity (Pa · s) 30° C. | Viscosity (Pa · s) 70° C | Viscosity (Pa · s) 175° C. | Thermal conductivity (W/mK) | Tg (° C.) | Elastic modulus (Pa, 30° C.) | Thermal expansion coefficient (ppm, 30° C.) | Plasticity | Fluidity | Solderability |
|---|---|---|---|---|---|---|---|---|---|---|---|
| Example 1 | None | 8605 | 14.8 | 2 | 1.2 | 120 | 1.50E+10 | 26 | Yes | 19 | OK |
| Example 2 | None | 1465 | 13.1 | 3.7 | 1.2 | 101 | 1.50E+10 | 22 | Yes | 18 | OK |
| Example 3 | None | 3738 | 8.9 | 1.2 | 1 | 125 | 1.50E+10 | 30 | Yes | 20 | OK |
| Example 4 | None | 4930 | 30 | 7.5 | 1.2 | 132 | 1.30E+10 | 20 | Yes | 16 | OK |
| Example 5 | None | 3280 | 10.9 | 3 | 1.2 | 114 | 1.30E+10 | 22 | Yes | 18 | OK |
| Example 6 | None | 1920 | 14.1 | 2.1 | 1.2 | 120 | 1.20E+10 | 25 | Yes | 19 | OK |
| Comparative Example 1 | Yes | 301 | 7.7 | 2.3 | 1.2 | 92 | 1.70E+10 | 28 | Yes | 19 | OK |

What is claimed is:

1. An underfill composition comprising:
   a hardening epoxy resin comprising a crystalline epoxy resin of not less than about 50 wt % relative to an entire resin composition, wherein the hardening epoxy resin has a viscosity of about 1000 Pa·s at 30° C., wherein the crystalline epoxy resin is a biphenyl epoxy resin with a molar weight of not more than about 500; and
   an inorganic filler having about 100 parts by mass relative to about 100 parts by mass of the entire resin composition.

2. The underfill composition according to claim 1, wherein the viscosity is not more than about 50 Pa·s at 70° C. and not more than about 10 Pa·s at 175° C.

3. The underfill composition according to claim 1, further comprising a fluxing agent.

4. The underfill composition according to claim 1, having a thermal conductivity of not less than about 1.0 W/mK.

5. A semiconductor device comprising:
   a first semiconductor element having a surface with a plurality of first electrodes provided thereon;
   a substrate or a second semiconductor element having a surface with a plurality of second electrodes provided thereon; and
   a hardened underfill composition as described in claim 1 disposed between the surface of the first semiconductor element and the surface of the substrate or the second semiconductor element;
   wherein the first electrodes and the second electrodes are electrically connected.

6. A manufacturing method for a semiconductor device, comprising the steps of:
   providing a first semiconductor element having a surface with a plurality of first electrodes provided thereon;
   providing a substrate or a second semiconductor element having a surface with a plurality of second electrodes provided thereon;
   applying an underfill composition as described in claim 1 to the surface of the first semiconductor element, the surface of the substrate or the second semiconductor element, or both surfaces;
   disposing the surface of the first semiconductor element so as to be facing the surface of the substrate or the second semiconductor element;
   liquefying the underfill composition with heat and electrically bonding the first electrodes and the second electrodes; and
   hardening the underfill composition.

7. The method according to claim 6, wherein applying the underfill composition includes printing the underfill composition onto the surface of the first semiconductor element.

8. The method according to claim 6, wherein applying the underfill composition comprises:
   printing the underfill composition onto an aqueous film;
   laminating the underfill composition printed onto the aqueous film on the first semiconductor element so that the underfill composition abuts the surface of the first semiconductor element; and
   dissolving the aqueous film.

9. The method according to claim 6, wherein the underfill composition is applied to a portion of the surface of the first semiconductor element.

10. The method according to claim 9, wherein a portion of the plurality of electrodes are exposed after the applying of the underfill composition, and the method further comprises positioning the first semiconductor element and the substrate or the second semiconductor element using the exposed electrodes.

11. The method according to claim 9, wherein the first semiconductor element is formed on a semiconductor wafer, and the method further comprises cutting the semiconductor wafer without cutting the underfill composition after applying the underfill composition, and splitting the semiconductor wafer into separate first semiconductor elements.

12. The method according to claim 11, further comprising picking up the split first semiconductor elements without touching the underfill composition.

* * * * *